United States Patent
Xi

(10) Patent No.: US 11,953,537 B2
(45) Date of Patent: Apr. 9, 2024

(54) TEST DEVICE AND TEST METHOD THEREOF

(71) Applicant: YUNGU (GU'AN) TECHNOLOGY CO., LTD., Hebei (CN)

(72) Inventor: Zhaoyang Xi, Jiangsu (CN)

(73) Assignee: Yungu (Gu'an) Technology Co., Ltd., Hebei (CN)

( * ) Notice: Subject to any disclaimer, the term of this patent is extended or adjusted under 35 U.S.C. 154(b) by 371 days.

(21) Appl. No.: 17/398,567

(22) Filed: Aug. 10, 2021

(65) Prior Publication Data

US 2021/0373067 A1    Dec. 2, 2021

Related U.S. Application Data

(63) Continuation of application No. PCT/CN2020/093493, filed on May 29, 2020.

(30) Foreign Application Priority Data

Jul. 29, 2019 (CN) .......................... 201910689367.1

(51) Int. Cl.
*G01R 31/26* (2020.01)
*H10K 50/155* (2023.01)
(Continued)

(52) U.S. Cl.
CPC ....... *G01R 31/2601* (2013.01); *H10K 50/155* (2023.02); *H10K 50/165* (2023.02); *H10K 50/17* (2023.02); *H10K 50/171* (2023.02)

(58) Field of Classification Search
CPC ............. G01R 31/2601; H10K 50/155; H10K 50/165; H10K 50/17; H10K 50/171; H10K 50/19; H10K 71/70
See application file for complete search history.

(56) References Cited

U.S. PATENT DOCUMENTS 6,737,127 B2 * 5/2004 Tsuboyama .......... H10K 85/731
                                                    428/917
7,976,959 B2   7/2011 Horiba et al.
(Continued)

FOREIGN PATENT DOCUMENTS

CN       1945871 A    4/2007
CN     101038954 A    9/2007
(Continued)

OTHER PUBLICATIONS

International Search Report and Written Opinion (International Application No. PCT/CN2020/093493) with English Translation, dated Aug. 28, 2020, 14 pages.
(Continued)

*Primary Examiner* — Alvaro E Fortich
(74) *Attorney, Agent, or Firm* — Quarles & Brady LLP

(57) ABSTRACT

Disclosed are a test device and a test method thereof. The test device includes a first electrode, an electron transport unit, a charge generation layer, a hole transport unit and a second electrode which are stacked; the charge generation layer includes an N-type doped layer and a P-type doped layer which is stacked on the N-type doped layer, the N-type doped layer is adjacent to the electron transport unit, and the P-type doped layer is adjacent to the hole transport unit.

20 Claims, 2 Drawing Sheets

(51) Int. Cl.
*H10K 50/165* (2023.01)
*H10K 50/17* (2023.01)

(56) References Cited

U.S. PATENT DOCUMENTS

| | | | |
|---|---|---|---|
| 2007/0046189 A1 | 3/2007 | Hatwar et al. | |
| 2009/0045728 A1 | 2/2009 | Murano et al. | |
| 2009/0261354 A1* | 10/2009 | Ha | H10K 50/155 |
| | | | 257/E33.044 |
| 2009/0294853 A1* | 12/2009 | Fenger | H01L 29/78696 |
| | | | 438/149 |
| 2011/0186821 A1* | 8/2011 | Schafer | H10K 85/633 |
| | | | 257/E51.026 |
| 2012/0261652 A1* | 10/2012 | Rothe | H10K 71/30 |
| | | | 438/47 |
| 2013/0240840 A1 | 9/2013 | Forrest et al. | |
| 2014/0340128 A1 | 11/2014 | Lindner et al. | |
| 2015/0279913 A1* | 10/2015 | Gates | H10K 59/123 |
| | | | 438/23 |
| 2015/0357596 A1* | 12/2015 | Loebl | H10K 50/131 |
| | | | 438/46 |
| 2017/0133616 A1* | 5/2017 | Kim | H10K 50/82 |
| 2018/0006224 A1 | 1/2018 | Lee et al. | |
| 2018/0159084 A1 | 6/2018 | Ma et al. | |
| 2019/0086487 A1 | 3/2019 | Jamali et al. | |

FOREIGN PATENT DOCUMENTS

| | | |
|---|---|---|
| CN | 201084751 Y | 7/2008 |
| CN | 101375429 A | 2/2009 |
| CN | 101661996 A | 3/2010 |
| CN | 101546812 B | 10/2010 |
| CN | 201622322 U | 11/2010 |
| CN | 102130302 A | 7/2011 |
| CN | 102388475 A | 3/2012 |
| CN | 102738414 A | 10/2012 |
| CN | 103022366 A | 4/2013 |
| CN | 103296221 A | 9/2013 |
| CN | 103378307 A | 10/2013 |
| CN | 104170114 A | 11/2014 |
| CN | 104365182 A | 2/2015 |
| CN | 104409649 A | 3/2015 |
| CN | 106199365 A | 12/2016 |
| CN | 106684250 A | 5/2017 |
| CN | 107452885 A | 12/2017 |
| CN | 107464829 A | 12/2017 |
| CN | 107611271 A | 1/2018 |
| CN | 108807341 A | 11/2018 |
| CN | 110456247 A | 11/2019 |

OTHER PUBLICATIONS

Chinese First Office Action 100191 (CN Application No. CN 201910689367.1) and Search Report with English Translation, dated Mar. 3, 2021, 24 pages.

Chinese Supplementary Search Report (CN Application No. CN 201910689367.1), dated Jul. 14, 2021, 2 pages.

* cited by examiner

TEST DEVICE AND TEST METHOD THEREOF

CROSS-REFERENCE TO RELATED APPLICATIONS

The present application is a continuation application of the PCT application No. PCT/CN2020/093493, filed on May 29, 2020, which claims priority to Chinese Patent Application No. 201910689367.1, filed on Jul. 29, 2019, and the contents of both applications are herein incorporated by reference in their entirety.

TECHNICAL FIELD

The present disclosure relates to the field of display technology.

BACKGROUND

The stacked OLED device consists of a charge generation layer connected in series with two light-emitting units, which can achieve high current efficiency at a low current density. Since low-current driving can prolong the service life of the OLED device, the stacked OLED device is widely used.

SUMMARY

In view of this, the present disclosure provides a test device and a test method thereof.

A test device includes a first electrode, an electron transport unit, a charge generation layer, a hole transport unit and a second electrode which are stacked;
the charge generation layer includes an N-type doped layer and a P-type doped layer which are stacked, the N-type doped layer is adjacent to the electron transport unit, and the P-type doped layer is adjacent to the hole transport unit.

A test method includes:
providing a plurality of test devices, a charge generation layer of each test device having a variable parameter, and values of variable parameters of the plurality of test devices being different;
applying a test voltage between a first electrode and a second electrode of each test device to cause the charge generation layer to generate a current, detecting the current flowing through each test device, and drawing a voltage-current curve according to the current varying with the test voltage; and/or
detecting a voltage of each test device under a fixed current density at a preset temperature, and drawing a voltage-time curve according to the voltage varying with the time;
determining an optimal value of the variable parameter according to the voltage-current curve and/or the voltage-time curve.

In the above-mentioned test device, the light-emitting layer is removed, accordingly the influence of the light-emitting layer on the performance of the device is avoided; and the charge generation capability and stability of the charge generation layer are tested individually, which can improve the test accuracy. In the above-mentioned test method, a plurality of the above test series are set, each test series includes a plurality of test devices, and one variable parameter is set in each test series, the voltage-current curve and/or voltage-time curve of the test devices are detected, and the charge generation layer with the maximum charge generation capability and stability is selected, thereby improving the luminous efficiency of the organic electroluminescent device during the manufacture of the organic electroluminescent device, and increasing the service life of the organic electroluminescent device.

DETAILED DESCRIPTION

In order to increase the service life of the stacked OLED, the charge generation layer thereof needs to have properties of efficient charge generation, charge transport and charge injection. Thus, how to make the charge generation layer efficiently generate carriers, quickly transport carriers, and effectively inject carriers are key issues for obtaining high-performance stacked OLED devices. However, at present, the charge generation layer has a weak charge generation capability, which causes the current efficiency of the stacked OLED to decrease, and accordingly the service life of the device is unsatisfied. Therefore, it is necessary to provide a test device and a test method to detect the parameters of the high-performance charge generation layer, thereby improving the efficiency of the stacked OLED.

In order to make the above objectives, features, and advantages of the present disclosure clearer and more understandable, specific embodiments of the present disclosure will be described in detail below with reference to the accompanying drawings. In the following description, many specific details are set forth in order to fully understand the present disclosure. However, the present disclosure can be implemented in many other ways different from those described herein, and those skilled in the art can make similar improvements without departing from the concept of the disclosure. Therefore, the present disclosure is not limited by the specific embodiments disclosed below.

Figure 1:
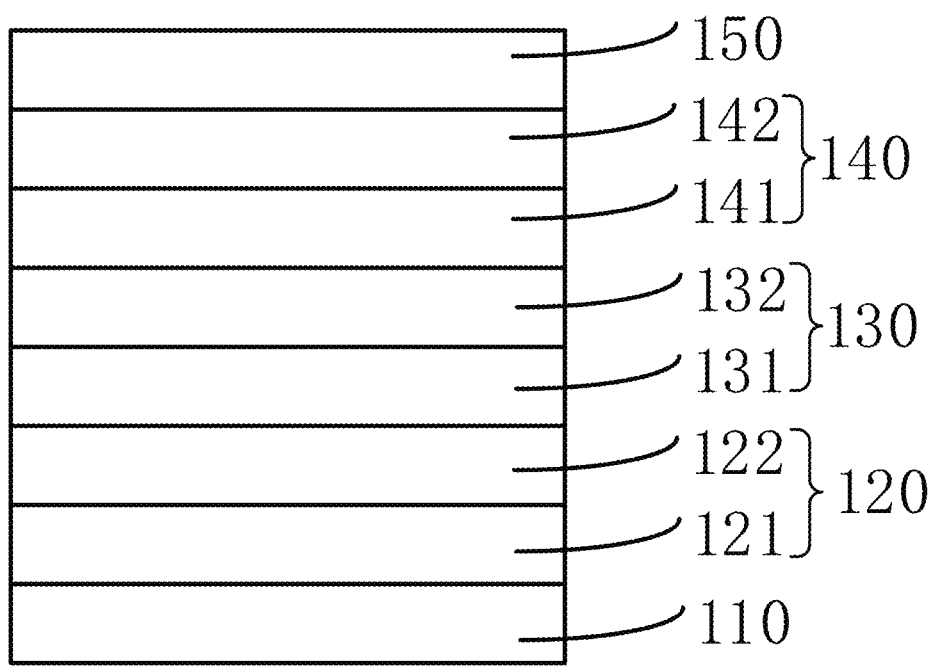
FIG. 1 is a schematic structure diagram of a test device according to an embodiment of the present disclosure.

Referring to FIG. 1, in an embodiment of the present disclosure, a test device is provided, which is configured to test an optimal value of a parameter of a charge generation layer to improve the charge generation capability of the charge generation layer, thereby increasing the service life of the stacked OLED device. The test device includes a first electrode 110, an electron transport unit 120, a charge generation layer 130, a hole transport unit 140, and a second electrode 150 which are stacked.

The electron transfer unit 120 is configured to transfer electron carriers. The electron transport unit 120 includes an electron injection layer 121 stacked on the first electrode 110 and an electron transport layer 122 stacked on the electron injection layer 121. The electron injection layer 121 is provided between the first electrode 110 and the electron transport layer 122. The material of the electron injection layer 121 can be a metal or a metallic compound with a low work function, such as lithium fluoride (LiF), ytterbium (Yb), terbium (Tm), and the like. The material of the electron transport layer 122 can be 1,3,5-tris (1-phenyl-1H-benzimidazol-2-yl) benzene (TPBi), tris (8-hydroxyquinoline) aluminum (Alq3), bis (2-methyl-8-hydroxyquinoline-N1,O8)-(1,1'-biphenyl-4-hydroxy) aluminum (BAlq), bathocuproine (BCP), tris [2,4,6-trimethyl-3-(3-pyridyl) phenyl] borane (3TPYMB) and the like.

The hole transport unit 140 is configured to transport hole carriers. The hole transport unit 140 includes a hole transport layer 141 stacked on the charge generation layer 130 and a hole injection layer 142 stacked on the hole transport layer 141. The hole transport layer 141 is provided between the charge generation layer 130 and the hole injection layer 142. The material of the hole transport layer 141 can be N,N'-bis (1-naphthyl)-N,N'-diphenyl-1,1'-biphenyl-4-4'-diamine (NPB), 4,4',4"-tris (N-carbazole) triphenylamine (TCTA), 1,1-bis [(di-4-tolylamino)phenyl] cyclohexane (TAPC), 1,3-bis (carbazol-9-yl) benzene (mCP) and so on. The material of the hole injection layer 142 can be molybdenum trioxide ($MoO_3$) or 2,3,6,7,10,11-hexacyano-1,4,5,8,9,12-hexaazatriphenylene (HAT-CN) and so on.

The charge generation layer 130 is configured to generate electron carriers and hole carriers. The charge generation layer 130 includes an N-type doped layer 131 and a P-type doped layer 132. The N-type doped layer 131 is configured to generate electron carriers and is stacked on the electron transport layer 122. The P-type doped layer 132 is configured to generate hole carriers and is stacked on the N-type doped layer 131, that is, between the N-type doped layer 131 and the hole transport layer 141. The N-type doped layer 131 is provided between the P-type doped layer 132 and the electron transport layer 122. The host material of the N-type doped layer 131 can be any one of bathocuproine (BCP), 4,7-diphenyl-1,10-phenanthroline (Bphen), 4,6-bis (3,5-bis (3-Pyridyl)phenyl)-2-methylpyrimidine (B3PYMPM), 1,3,5-tris (3-(3-pyridyl) phenyl) benzene (TmPyPB). The N-type doping material of the N-type doped layer 131 can be at least one of lithium (Li), cesium (Cs), ytterbium (Yb), and lithium fluoride (LiF). The host material of the P-type doped layer 132 can be N,N'-bis (naphthalene-2-yl)-N,N'-bis (phenyl)biphenyl-4,4'-diamine (NPB), 4,4',4"-tris (carbazol-9-yl) triphenylamine (TCTA), 4,4'-cyclohexylbis [N,N-bis (4-methylphenyl)] aniline (TAPC), 1,3-dicarbazol-9-ylbenzene (mCP). The P-type doping material of the P-type doped layer 132 can be at least one of molybdenum trioxide (MoO3), 2,3,6,7,10,11-hexacyano-1,4,5,8,9,12-hexaazatriphenylene (HAT-CN), 2,3,5,6-tetrafluoro-tetracyano-1,4-benzoquinodimethane (F4-TCNQ), and the like.

The charge generation capability of the charge generation layer 130 is related to the N-type doping material, the N-type doping concentration, the thickness of the N-type doped layer, and the P-type doping material, the P-type doping concentration, and the thickness of the P-type doped layer. In this embodiment, the test device is designed and the test method is applied to detect the charge generation capability of the charge generation layer 130 under different parameter values, to select a parameter value of the charge generation layer 130 with a strong charge generation capability and a stable performance.

In an embodiment, the first electrode 110 can be an anode, and the second electrode 150 can be a cathode. The electron injection layer 121 and the electron transport layer 122 are stacked on the anode. And the electron transport layer 122 is adjacent to the N-type doped layer 131. The P-type doped layer 132 is stacked on the N-type doped layer 131. The hole transport layer 141 is stacked on the P-type doped layer 132; the hole injection layer 142 is stacked on the hole transport layer 141; and the hole injection layer 142 is adjacent to the cathode. At the moment, a forward voltage can be applied between the first electrode 110 and the second electrode 150 to cause the charge generation layer 130 to generate a current; and the relationship between the current generated by the charge generation layer 130 with different parameter values and the external voltage can be detected. Under the same voltage, the faster the current rises, the better the charge generation capability of the charge generation layer 130 is. It is also possible to apply a specific current to the device, to test the voltage of the test device of the charge generation layer 130 with different parameter values, and detect a rising curve of the voltage over time. The smaller the voltage rising in the same period, the more stable the performance of the charge generation layer 130.

In another embodiment, the first electrode 110 can be a cathode, and the second electrode 150 can be an anode. The electron injection layer 121 is stacked on the cathode 110; meanwhile, the electron transport layer 122 is stacked on the electron injection layer 121, and the electron transport layer 122 is adjacent to the N-type doped layer 131. The P-type doped layer 132 is stacked on the N-type doped layer 131. The hole transport layer 141 is stacked on the P-type doped layer 132, while the hole injection layer 142 is stacked on the hole transport layer 141, and the hole injection layer 142 is adjacent to the anode 150. At the moment, a reverse voltage can be applied between the first electrode 110 and the second electrode 150 to cause the charge generation layer 130 to generate a current, and the relationship between the current generated by the charge generation layer 130 with different parameter values and the external voltage can be detected. Similarly, it is also possible to apply a specific current to the device, to test the voltage of the test device of the charge generation layer 130 with different parameter values and test the rising curve of the voltage over time, in order to screen out the optimal value of the parameter of the charge generation layer 130.

In the test device provided in the above embodiment, a light-emitting layer is removed, which avoids the effect of the light-emitting layer on the performance of the device. In addition, the charge generation capability and stability of the charge generation layer 130 are tested individually, which can improve the accuracy of the test.

Figure 2:
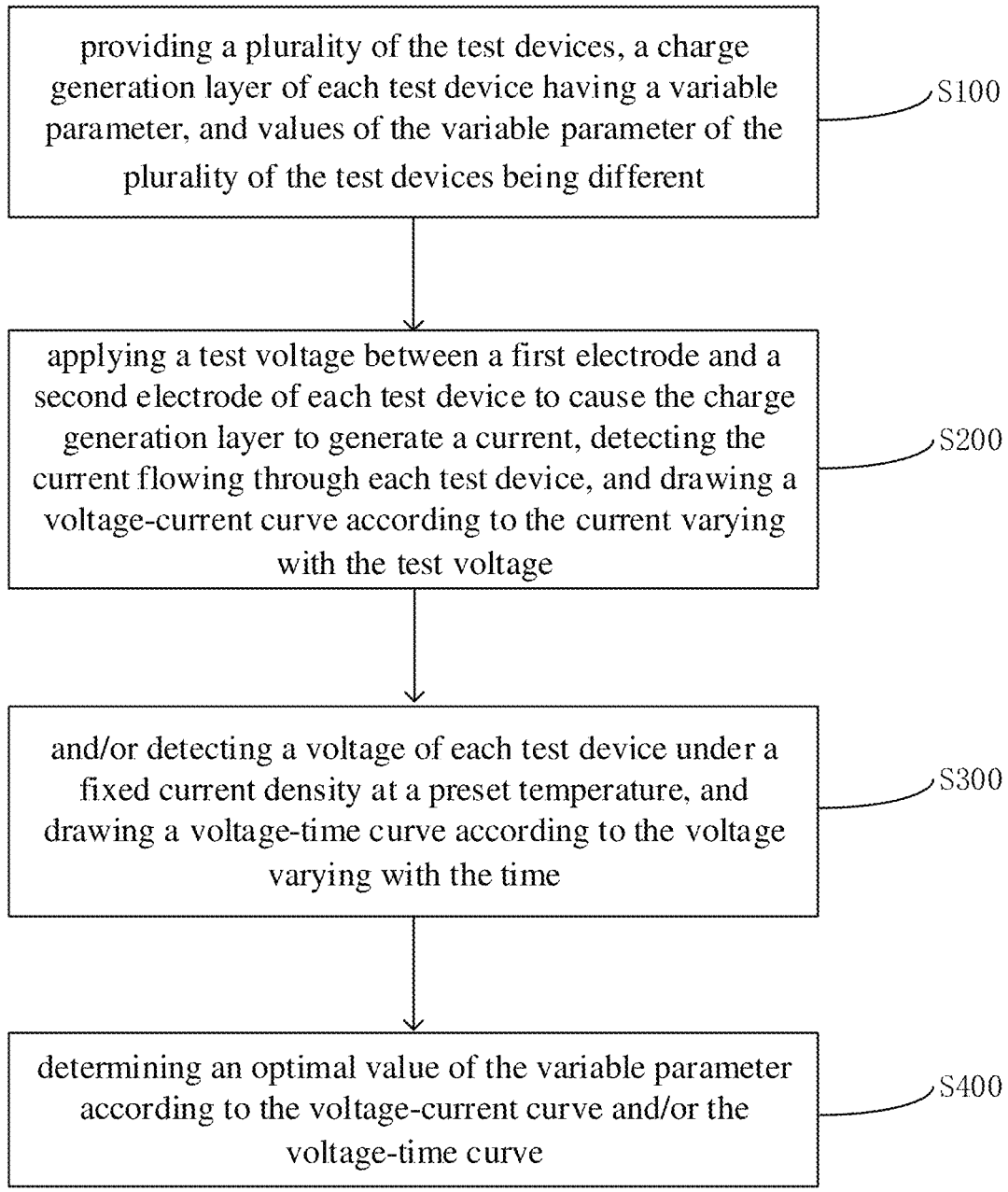
FIG. 2 is a flow chart of a test method according to an embodiment of the present disclosure.

Referring to FIG. 2, according to the above-mentioned test device, a test method is further provided in the present disclosure, which includes the following steps:

S100: a plurality of test devices are provided; the test devices are the above-mentioned test device. A charge generation layer 130 of each test device has one variable parameter, and values of the variable parameters of the charge generation layers 130 of the plurality of test devices are different.

Specifically, in this embodiment, multiple test devices with the same variable parameter can be grouped into one test series, and the same variable parameter can be tested multiple times to improve the accuracy of the test. In this embodiment, a plurality of test series can be provided; each test series includes at least two test devices; and the number of test devices included in each test series is the same. For example, each test series includes three test devices, and the three test devices have the same structure and only have one variable parameter; and the values of the variable parameters corresponding to the three test devices are different. The variable parameter can be one of the N-type doping material, the N-type doping concentration, the thickness of the N-type doping layer, the P-type doping material, the P-type doping concentration, the thicknesses of the P-type doped layer. For example, a series I includes three test devices. The P-type doping materials, the P-type doping concentrations, and the thicknesses of the P-type doped layers of the three test devices are respectively the same; the N-type doping materials and the N-type doping concentrations of the N-type doped layers of the three test devices are respectively the same, but the thicknesses of the N-type doped layers of the three test devices change in a gradient. That is, the variable parameter of the series I is the thickness of the N-type doped layer, and the series I can be configured to test the effect of the thickness of the N-type doped layer.

A series II includes three test devices. The P-type doping materials, the P-type doping concentrations and the thicknesses of the P-type doped layers of the three test devices have the same values as the corresponding parameters of the P-type doped layers of the three test devices in the series I. The N-type doping materials of the N-type doped layers of the three test devices in the series II are the same as the N-type doping materials in the series I; the N-type doping concentrations of the three test devices in the series II are the same, but different from the N-type doping concentrations of the test devices in the series I; the thicknesses of the N-type doped layers of the three test devices in the series II are different, which change in a gradient. That is, the variable parameter of the series II is also the thickness of the N-type doped layer, which can also be configured to test the effect of the thickness of the N-type doped layer. At the same time, when the series II is compared with the series I, the effect of the N-type doping concentration can be compared under the condition of same thickness of the N-type doped layer.

A series III includes three test devices. The values of the P-type doping materials, the P-type doping concentrations and the thicknesses of the P-type doped layers of the three test devices are the same as the values of the corresponding parameters of the P-type doped layers of the three test devices in the series I. The N-type doping materials of the N-type doped layers of the three test devices in the series III are the same as that of the series I and series II; but the N-type doping concentrations are different, changing in a gradient; the thicknesses of the N-type doped layers are the same. That is, the variable parameter of the series III is the N-type doping concentration, accordingly, the series III can be configured to test the effect of the N-type doping concentration.

A series IV includes three test devices. The P-type doping materials, the P-type doping concentrations and the thicknesses of the P-type doped layers of the three test devices are the same as the P-type doping materials, the P-type doping concentrations, and the thicknesses of the P-type doped layers of the three test devices in the series I. The N-type doping materials of the three test devices in the series IV are the same, but different from the N-type doping materials in the series III. The N-type doping concentrations of the three test devices in the series IV are different, changing in a gradient; but the thicknesses of the N-type doped layers are the same. That is, the variable parameter of the series IV is also the N-type doping concentration, which can also be configured to test the effect of the N-type doping concentration. At the same time, compared to the test series III, the effects of the type doping materials can be compared in a condition of the same N-type doping concentration.

It can be seen from the above embodiment that the charge generation layer 130 of the test device in each series can further have a relatively variable parameter, that is, the relatively variable parameter of the test devices in the same series has the same value, and the relatively variable parameters of the test devices in different series have different values. The relative variable parameter can be one of the N-type doping material, the N-type doping concentration, and the thickness of the N-type doped layer.

Similarly, four more series can be provided. The N-type doping materials, the N-type doping concentrations, and the thicknesses of the N-type doped layers of the three test devices in each series are the same. The P-type doped layers of the three test devices in each series correspond to only one variable parameter, and the variable parameter can be any one of the P-type doping material, the P-type doping concentration, and the thickness of the P-type doped layer. There may exist a relatively variable parameter between any two or more series, and the relatively variable parameter can be any one of the P-type doping material, the P-type doping concentration, and the thickness of the P-type doped layer. By individually detecting the effect of each parameter value of the N-type doped layer on the charge generation layer and the effect of each parameter value of the P-type doped layer on the charge generation layer, the optimal value of each parameter of the N-type doped layer and the optimal value of each parameter of the P-type doped layer is selected.

In order to improve the accuracy of the test result, more test series can be provided, which will not be listed all here.

S200: a test voltage is applied between the first electrode and the second electrode of each test device to cause the charge generation layer to generate a current, the current flowing through each test device is detected, and a voltage-current curve according to the current varying with the test voltage is drawn.

In an embodiment, the parameter value of the N-type doped layer and the parameter value of the P-type doped layer can be obtained through the voltage-current curve of each test device, to improve the charge generation capability of the charge generation layer.

Specifically, in an embodiment, when the first electrode is an anode and the second electrode is a cathode, the test voltage applied between the first electrode and the second electrode is a forward voltage, that is, the anode is positive and the cathode is negative. At the moment, the charge generation layer in the test device generates a first internal current, and a direction of the first internal current is from the anode to the cathode. The first internal current of each test device changing with the voltage in each test series is detected, and the voltage-current curve is drawn. It should be noted that, for each test series, a change range of the test voltage is the same, for example, it can be a range of 0V to 8V. Since the test device can include a relatively variable parameter, the relative variable parameter of the test devices in the same series has the same value; and the values of the relatively variable parameters of the test devices in different series are different. Therefore, the optimal value of each parameter of the N-type doped layer and the P-type doped layer can be obtained by comparing the voltage-current curves.

In another embodiment, when the first electrode is a cathode and the second electrode is an anode, the test voltage applied between the first electrode and the second electrode is a reverse voltage, that is, the anode is negative and the cathode is positive. At the moment, the charge generation layer in the test device generates a second internal current, and a direction of the second internal current is from the cathode to the anode. Similarly, the second internal current of each test device changing with the voltage in each test series is respectively detected, and the voltage-current curve is drawn; and for each test series, the change range of the test voltage is the same. The optimal value of each parameter of the N-type doped layer and the P-type doped layer is obtained by comparing the voltage-current curves.

When the first electrode is the cathode and the second electrode is the anode, a break-over voltage can also be applied between the first electrode and the second electrode, the break-over voltage is forward, such that the test device is turned on under the action of the break-over voltage and generate an external current. The external current is a current generated by the anode and cathode under the action of the break-over voltage. The direction of the external current is from the anode to the cathode. A test voltage-second internal current curve and a break-over voltage-external current curve of each test device are drawn. When the more similar the test voltage-second internal current curve is to the break-over voltage-external current curve, the better the charge generation capability of the device. Specifically, when comparing the test voltage-second internal current curve with the break-over voltage-external current curve, the second internal current can be compared to the external current under the same test voltage and break-over voltage. When a difference value between the second internal current and the external current is less than a preset value, the charge generation capability of the corresponding charge generation layer is better.

S300: the voltage of each test device under a fixed current density is detected at a preset temperature, and a voltage-time curve is drawn according to a changing curve of the voltage with the time. In an embodiment, a fixed current can be applied to the test device at a preset temperature. The voltage of the test device under a fixed current density is measured, and the voltage change of the test device with the time is detected after the test device is energized for a period of time, and a voltage-time curve is drawn to select the parameter value of the best stable charge generation layer as the optimal value. In this embodiment, the preset temperature includes a first preset temperature and a second preset temperature, and the voltage change with the time under a fixed current density can be detected at the first preset temperature and the second preset temperature respectively. The first preset temperature is greater than the second preset temperature; the second preset temperature is a normal temperature, which may specifically be 25° C.; the first preset temperature is a high temperature, which may specifically be 85° C.

Specifically, in this embodiment, the first electrode may be an anode and the second electrode may be a cathode, or the first electrode may be a cathode and the second electrode may be an anode. A same current is applied to the test devices of each series, and the change in the voltage with the time between the first electrode and the second electrode of the test device in each test series is detected within a certain period of time, and the voltage-time curve is drawn. According to the voltage-time curve, a test device with the smallest voltage change with the time in a certain period of time is determined, and the stability of the charge generation layer of the test device is higher.

In this embodiment, the voltages of the test devices in each series under the conditions of 25° C. and 85° C. within 160 hours can be respectively detected. The voltage-time curve in a range of 0 to 1000 hours is simulated according to the voltage-time curve in a range of 0 to 160 hours at 85° C.; a curve with the smallest voltage change is selected, and the value of the variable parameter of the charge generation layer of the corresponding device is the optimal value. Alternatively, the voltage-time curve in a range of 0 to 10000 hours is simulated according to the voltage-time curve in the range of 0 to 160 hours at 25° C., the curve with the smallest voltage change is selected, and the value of the variable parameter of the charge generation layer of the corresponding test device is the optimal value. It is also possible to simultaneously test the voltage-time curves of the test device in each series at the high temperature and normal temperature, and select the test devices corresponding to the range of 0 to 1000 hours at 85° C. and the range of 0 to 10000 hours at 25° C. The voltage rise is less than 1.5V; and the performance of the charge generation layer of the corresponding test device is optimum, and the value of the variable parameter is the optimal value.

In another embodiment, the voltage-current curve and the voltage-time curve of the test device in each test series can be simultaneously measured, and the value of the parameter of the charge generation layer with strong charge generation capability and good stability is selected according to the voltage-current curve and the voltage-time curve as the optimal value.

The test method may include one or both of the step S200 and step S300.

S400: the optimal values of the variable parameters of the N-type doped layer and the P-type doped layer are determined according to the voltage-current curve and/or the voltage-time curve.

In an embodiment, the optimal value of the variable parameter is selected from the values of the variable parameters of the plurality of test devices according to the voltage-current curve and/or the voltage-time curve.

By comparing the voltage-current curves of the test devices in multiple test series, the test device, the current of which rises faster with the voltage, is selected. The faster the current rises, the better the charge generation capability of the charge generation layer of the corresponding test device, and the value of the variable parameter of the test device with the fastest current rise is the optimal value.

By comparing the voltage-time curves of the test devices of multiple test series, a test device with voltage rising slowly under the high temperature and normal temperature in a period of time is selected. The slower the voltage rise, the better the stability of the charge generation layer of the corresponding test device at the normal temperature and high temperature, and the value of the variable parameter of the test device with the slowest voltage rise is the optimal value. When the voltage rise is less than 1.5V within 1000 hours at the high temperature (85° C.) and/or within 10000 hours at the normal temperature (25° C.), the stability of the charge generation layer is better.

For example, in an embodiment, according to the above-mentioned test method, the finally selected material of the N-type doped layer is Yi (Ytterbium), and the thickness of the N-type doped layer is in a range of 50 Å to 150 Å, the optimal thickness is 100 Å; the doping concentration is in a range of 1% to 5%, the optimal doping concentration is 3%. The material of the P-type doped layer is molybdenum trioxide, the thickness thereof is in a range of 50 Å to 150 Å, the optimal thickness is 100 Å; the doping concentration is in a range of 5% to 15%, and the optimal doping concentration is 10%.

Further, the charge generation layer of the organic electroluminescent device can be manufactured according to the optimal values of the parameters of the N-type doped layer and the optimal values of the parameters of the P-type doped layer, to improve the luminous efficiency of the organic electroluminescent device, thereby improving the service life of the organic electroluminescent device.

In the test method provided in the foregoing embodiment, a plurality of test series are set, and each test series includes at least two test devices. A relatively variable parameter is set between the two test series, the voltage-current curve and/or voltage-time curve of the test device is detected, and the value of each parameter of the charge generation layer with the maximum charge generation capability and the best stability is selected. Accordingly, when the organic electroluminescent device is manufactured, the luminous efficiency of the organic electroluminescent device is improved, thereby increasing the service life of the organic electroluminescent device.

The technical features of the above-mentioned embodiments can be combined arbitrarily. In order to make the description concise, all possible combinations of the various technical features in the above-mentioned embodiments are not described herein. However, as long as there is no contradiction in the combination of these technical features, all should be considered as the scope of the present disclosure.

The above-mentioned embodiments are merely some exemplary embodiments of the present disclosure, and their descriptions are more specific and detailed, but they should not be understood as a limitation on the scope of the present disclosure. It should be pointed out that those of ordinary skill in the art can make several modifications and improvements without departing from the concept of the disclosure, and these all fall within the protection scope of the present disclosure. Therefore, the scope of protection of the present disclosure shall be subject to the appended claims.

What is claimed is:

1. A test device, comprising a first electrode, an electron transport unit, a charge generation layer, a hole transport unit and a second electrode which are stacked; and
    wherein the charge generation layer comprises an N-type doped layer and a P-type doped layer which are stacked, the N-type doped layer is adjacent to the electron transport unit, and the P-type doped layer is adjacent to the hole transport unit;
    wherein the electron transport unit is directly attached between the first electrode and the charge generation layer, the charge generation layer is directly attached between the electron transport unit and the hole transport unit, and the hole transport unit is directly attached between the second electrode and the charge generation layer.

2. The test device according to claim 1, wherein the first electrode comprises an anode and the second electrode comprises a cathode.

3. The test device according to claim 1, wherein the first electrode comprises a cathode and the second electrode comprises an anode.

4. The test device according to claim 1, wherein the electron transport unit comprises an electron injection layer and an electron transport layer stacked between the first electrode and the N-type doped layer, the electron injection layer is adjacent to the first electrode, the electron transport layer is adjacent to the N-type doped layer; and
    the hole transport unit comprises a hole injection layer and a hole transport layer stacked between the second electrode and the P-type doped layer, the hole injection layer is adjacent to the second electrode, the hole transport layer is adjacent to the P-type doped layer.

5. The test device according to claim 4, wherein a material of the electron injection layer is a metal or a metallic compound having a low work function.

6. The test device according to claim 1, wherein the N-type doped layer is configured to generate electron carriers, and the P-type doped layer is configured to generate hole carriers.

7. The test device according to claim 1, wherein a host material of the N-type doped layer is one or more of bathocuproine (BCP), 4,7-diphenyl-1,10-phenanthroline (Bphen), 4,6-bis (3,5-bis (3-Pyridyl)phenyl)-2-methylpyrimidine (B3PYMPM), 1,3,5-tris (3-(3-pyridyl) phenyl) benzene (TmPyPB).

8. The test device according to claim 1, wherein a N-type doping material of the N-type doped layer is one or more of lithium (Li), cesium (Cs), ytterbium (Yb), and lithium fluoride (LiF).

9. The test device according to claim 1, wherein a host material of the P-type doped layer is one or more of N,N'-bis (naphthalene-2-yl)-N,N'-bis (phenyl)biphenyl-4,4'-diamine (NPB), 4,4',4"-tris (carbazol-9-yl) triphenylamine (TCTA), 4,4'-cyclohexylbis [N,N-bis (4-methylphenyl)] aniline (TAPC), 1,3-dicarbazol-9-ylbenzene (mCP).

10. The test device according to claim 1, wherein a P-type doping material of the P-type doped layer is one or more of molybdenum trioxide ($MoO_3$), 2,3,6,7,10,11-hexacyano-1,4,5,8,9,12-hexaazatriphenylene (HAT-CN), 2,3,5,6-tetrafluoro-tetracyano-1,4-benzoquinodimethane (F4-TCNQ).

11. A test method, comprising:
    providing a plurality of the test devices of claim 1, the charge generation layer of each test device having a variable parameter, and values of the variable parameters of the plurality of the test devices being different;
    applying a test voltage between the first electrode and the second electrode of each test device to cause the charge generation layer to generate a current, detecting the current flowing through each test device, and drawing a voltage-current curve according to the current varying with the test voltage; and/or
    detecting a voltage of each test device under a fixed current density at a preset temperature, and drawing a voltage-time curve according to the voltage varying with the time;
    determining an optimal value of the variable parameter according to the voltage-current curve and/or the voltage-time curve.

12. The test method according to claim 11, wherein the determining the optimal value of the variable parameter comprises selecting the optimal value of the variable parameter from the values of the variable parameters of the plurality of the test devices.

13. The test method according to claim 11, wherein the variable parameter is any one of an N-type doping material of the N-type doped layer, an N-type doping concentration, a thickness of the N-type doped layer, a P-type doping material of the P-type doped layer, a P-type doping concentration, and a thickness of the P-type doped layer.

14. The test method according to claim 11, wherein the first electrode is an anode, and the second electrode is a cathode;
    the applying the test voltage between the first electrode and the second electrode of each test device comprises:
    configuring the test voltage as a forward voltage to cause the charge generation layer to generate a first internal current, detecting the first internal current of the test device, and drawing the voltage-current curve according to the first internal current varying with the forward voltage.

15. The test method according to claim 11, wherein the first electrode is a cathode and the second electrode is an anode;
    the applying the test voltage between the first electrode and the second electrode of each test device comprises:
    configuring the test voltage as a reverse voltage to cause the charge generation layer to generate a second internal current, detecting the second internal current of the test device, and drawing the voltage-current curve according to the second internal current varying with the reverse voltage.

16. The test method according to claim 15, further comprising:
applying a break-over voltage between the anode and the cathode of each test device to make each test device turned on, generating, by the anode and the cathode, an external current under an action of the break-over voltage, detecting the external current of each test device and drawing a relationship curve of the external current and the break-over voltage;
determining the optimal value of the variable parameter according to the second internal current and the external current; and
when the test voltage is the same as the break-over voltage, if a difference value between the second internal current and the external current is less than a preset value, determining a value of the variable parameter of the corresponding test device as the optimal value.

17. The test method according to claim 11, wherein the preset temperature comprises a first preset temperature and a second preset temperature, and the first preset temperature is greater than the second preset temperature;
the detecting the voltage of each test device under the fixed current density and drawing the voltage-time curve according to the voltage varying with the time comprises:
detecting the voltages of each test device under the fixed current density at the first preset temperature and the second preset temperature respectively, and drawing the voltage-time curve according to the voltage varying with the time.

18. The test method according to claim 17, wherein when a voltage rise amplitude is less than 1.5V within 1000 hours at the first preset temperature, determining the value of the variable parameter of the corresponding test device as the optimal value according to the voltage-time curve.

19. The test method according to claim 18, wherein when the voltage rise amplitude is less than 1.5V within 10,000 hours at the second preset temperature, determining the value of the variable parameter of the corresponding test device as the optimal value according to the voltage-time curve.

20. A test device, comprising a first electrode, an electron transport unit, a charge generation layer, a hole transport unit and a second electrode which are stacked; and
wherein the charge generation layer comprises an N-type doped layer and a P-type doped layer which are stacked, the N-type doped layer is adjacent to the electron transport unit, and the P-type doped layer is adjacent to the hole transport unit;
wherein the first electrode is an anode and the second electrode is a cathode, the charge generation layer is configured to generate a first internal current when a test voltage applied between the first electrode and the second electrode is a forward voltage, to allow drawing a voltage-current curve according to the first internal current varying with the forward voltage; or
wherein the first electrode is a cathode and the second electrode is an anode, the charge generation layer is configured to generate a second internal current when a test voltage applied between the first electrode and the second electrode is a reverse voltage, to allow drawing a voltage-current curve according to the second internal current varying with the reverse voltage.

\* \* \* \* \*